(12) United States Patent
Papasouliotis

(10) Patent No.: US 7,109,129 B1
(45) Date of Patent: Sep. 19, 2006

(54) OPTIMAL OPERATION OF CONFORMAL SILICA DEPOSITION REACTORS

(75) Inventor: George D. Papasouliotis, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/077,108

(22) Filed: Mar. 9, 2005

(51) Int. Cl.
*H01L 21/31* (2006.01)

(52) U.S. Cl. ............... 438/761; 438/778; 438/909; 438/781; 438/789; 438/790; 257/E21.564

(58) Field of Classification Search ........... 438/761, 438/778, 909, 781, 789, 790
See application file for complete search history.

(56) References Cited

U.S. PATENT DOCUMENTS

| | | | |
|---|---|---|---|
| 5,314,724 A | 5/1994 | Tsukune et al. | |
| 5,525,550 A | 6/1996 | Kato | |
| 5,527,561 A | 6/1996 | Dobson | |
| 5,705,028 A | 1/1998 | Matsumoto | |
| 5,985,770 A | 11/1999 | Sandhu et al. | |
| 6,030,881 A | 2/2000 | Papasouliotis et al. | |
| 6,102,993 A | 8/2000 | Bhandari et al. | |
| 6,133,160 A | 10/2000 | Komiyama et al. | |
| 6,184,143 B1 | 2/2001 | Ohashi et al. | |
| 6,300,219 B1 | 10/2001 | Doan et al. | |
| 6,316,063 B1 | 11/2001 | Andideh et al. | |
| 6,335,261 B1 | 1/2002 | Natzle et al. | |
| 6,352,943 B1 | 3/2002 | Maeda et al. | |
| 6,352,953 B1 | 3/2002 | Seki et al. | |
| 6,372,669 B1 | 4/2002 | Sandhu et al. | |
| 6,503,330 B1 | 1/2003 | Sneh et al. | |
| 6,511,399 B1 | 1/2003 | McCollum Etchason et al. | |
| 6,511,539 B1 | 1/2003 | Raaijmakers | |
| 6,531,377 B1 | 3/2003 | Knorr et al. | |
| 6,534,395 B1 | 3/2003 | Werkhoven et al. | |
| 6,534,802 B1 | 3/2003 | Schuegraf | |
| 6,540,838 B1 | 4/2003 | Sneh et al. | |
| 6,551,339 B1 | 4/2003 | Gavronsky | |
| 6,802,944 B1 * | 10/2004 | Ahmad et al. | 204/192.23 |
| 6,861,334 B1 | 3/2005 | Raaijmakers et al. | |
| 6,867,152 B1 * | 3/2005 | Hausmann et al. | 438/778 |
| 6,908,862 B1 * | 6/2005 | Li et al. | 438/700 |
| 2001/0049205 A1 | 12/2001 | Sandhu et al. | |
| 2003/0015764 A1 | 1/2003 | Raaijmakers et al. | |
| 2003/0092241 A1 | 5/2003 | Doan et al. | |

(Continued)

FOREIGN PATENT DOCUMENTS

WO    WO02/27063    4/2002

(Continued)

OTHER PUBLICATIONS

U.S. Office Action mailed Dec. 30, 2005, from U.S. Appl. No. 11/026,284.

(Continued)

*Primary Examiner*—Asok K. Sarkar
*Assistant Examiner*—Victor V. Yevsikov
(74) *Attorney, Agent, or Firm*—Beyer Weaver & Thomas LLP

(57) ABSTRACT

Methods of forming conformal films that reduce the amount of metal-containing precursor and/or silicon containing precursor materials required are described. The methods increase the amount of film grown following each dose of metal-containing and/or silicon-containing precursors. The methods may involve introducing multiple doses of the silicon-containing precursor for each dose of the metal-containing precursor and/or re-pressurizing the process chamber during exposure to a dose of the silicon-containing precursor. The methods of the present invention are particularly suitable for use in RVD processes.

16 Claims, 9 Drawing Sheets

U.S. PATENT DOCUMENTS

| | | |
|---|---|---|
| 2003/0129828 A1* | 7/2003 | Cohen .................. 438/629 |
| 2003/0157781 A1 | 8/2003 | Macneil et al. |
| 2004/0004247 A1 | 1/2004 | Forbes et al. |
| 2004/0043149 A1 | 3/2004 | Gordon et al. |
| 2004/0044127 A1 | 3/2004 | Okubo et al. |
| 2004/0079728 A1* | 4/2004 | Mungekar et al. ......... 216/67 |
| 2004/0102031 A1 | 5/2004 | Kloster et al. |
| 2004/0206267 A1 | 10/2004 | Sambasivan et al. |
| 2005/0054213 A1* | 3/2005 | Derderian et al. ......... 438/778 |
| 2005/0112282 A1* | 5/2005 | Gordon et al. ......... 427/255.18 |
| 2005/0239264 A1* | 10/2005 | Jin et al. ............... 438/424 |
| 2006/0038293 A1* | 2/2006 | Rueger et al. ............. 257/751 |

FOREIGN PATENT DOCUMENTS

| | | | |
|---|---|---|---|
| WO | WO03/083167 A1 | 9/2003 | |

OTHER PUBLICATIONS

U.S. Office Action mailed Dec. 7, 2005, from U.S. Appl. No. 10/874,808.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Dec. 5, 2005, from U.S. Appl. No. 10/746,274.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35µm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$ ", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 µm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atmospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Cho et al., "Hydroxyl Bond Removal and Film Densification Method for Oxide Films Using Microwave Post Treatment", Novellus Systems, Inc., Appln. No. Not yet assigned, filed Nov. 15, 2005, pp. 1-27.

U.S. Office Action mailed Nov. 10, 2005, from U.S. Appl. No. 11/021,558.

Ritala et al., "Atomic Layer Deposition", Handbook of Thin Films Materials, vol. 1, 2002, pp. 103-159.

Dennis Michael Hausmann, "Atomic Layer Deposition of Metal Oxide Thin Films," A thesis presented by, Harvard University, 186 pages, July 2002.

Hausmann et al., "Rapid Vapor Deposition of Highly Conformal Silica Nanolaminates," Science, vol. 308, Oct. 2002, 5 pages.

Gordon et al., "A Kinetic Model for Step Coverage by Atomic Layer Deposition in Narrow Holes or Trenches", Chemical Vapor Deposition 2003, 9, No. 2, pp. 73-78.

Papasouliotis et al., Methods for Forming High Density, Conformal, Silica Nanolaminate Films Via Pulsed Deposition Layer In Structures of Confined Geometry, Novellus Systems, Inc., U.S. Appl. No. 11/026,284, filed Dec. 30, 2004, pp. 1-24.

Papasouliotis, George D., "Optimal Operation of Conformal Silica Deposition Reactors", Novellus Systems, Inc., U.S. Appl. No. 11/077,198, filed Mar. 9, 2005, pp. 1-32.

* cited by examiner

OPTIMAL OPERATION OF CONFORMAL SILICA DEPOSITION REACTORS

CROSS-REFERENCE TO RELATED APPLICATION

This application is related to U.S. patent application Ser. No. 11/077,198, filed Mar. 9, 2005.

FIELD OF THE INVENTION

This invention pertains to methods for forming high density, conformal, silica nanolaminate films. More specifically, the invention pertains to methods of depositing a conformal film of dielectric material on semiconductor substrates and in structures of confined geometry such as high aspect ratio gaps.

BACKGROUND OF THE INVENTION

Layers of dielectric film are used in several applications in sub-micron integrated circuits (ICs) fabrication. Four such applications are shallow trench isolation (STI), pre-metal dielectric (PMD), inter-metal dielectric (IMD) and interlayer dielectric (ILD). All four of these layers require silicon dioxide films that fill features of various sizes and have uniform film thicknesses across the wafer.

Chemical vapor deposition (CVD) has traditionally been the method of choice for depositing conformal silicon dioxide films. However, as design rules continue to shrink, the aspect ratios (depth to width) of features increase, and traditional CVD techniques can no longer provide adequately conformal films in these high aspect ratio features.

Two alternatives to CVD are atomic layer deposition (ALD) and rapid vapor deposition (RVD). ALD methods involve self-limiting adsorption of reactant gases and can provide thin, conformal dielectric films within high aspect ratio features. ALD methods have been developed for the deposition of silicon oxide film. RVD processing (also known as pulsed deposition layer (PDL) processing) is similar to ALD in that reactant gases are introduced alternately over the substrate surface. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. In RVD the silicon oxide film can grow more thickly. Thus, RVD methods allow for rapid film growth similar to using CVD methods but with the film conformality of ALD methods.

The cost of chemicals needed to deposit a given amount of oxide is inversely proportional to reactant conversion. Reactant conversion in a RVD reactor is typically significantly lower than one and is dependent on process conditions. Thus, in conventional RVD (and ALD) reactors, a significant amount of the silicon-containing precursor is not utilized. Because conformal deposition processes require reactants of high purity, recovering the silicon-containing precursor in a recycle stream is impractical. Unreacted precursor is lost. In addition, the amount of oxide deposited for a given dose of metal-containing precursor is limited, requiring more metal-containing precursor.

What is therefore needed are improved methods for forming conformal films that reduce the amount of metal-containing precursor and/or silicon-containing precursor required to deposit a given amount of film on a substrate.

SUMMARY OF THE INVENTION

The present invention meets these needs by providing methods of forming conformal films that reduce the amount of metal-containing and/or silicon containing precursor materials required. The methods of the present invention increase the amount of film grown following each dose of metal-containing precursor. In some embodiments, the methods of the present invention increase conversion of the silicon-containing precursor. The methods may involve introducing multiple doses of the silicon-containing precursor for each dose of the metal-containing precursor and/or re-pressurizing the process chamber during exposure to a dose of the silicon-containing precursor. The methods of the present invention are particularly suitable for use in RVD processes.

One aspect of the invention relates to methods of filling a gap on a semiconductor substrate involving including multiple doses of the silicon-containing precursor for each dose of the metal-containing precursor. The methods involve providing a semiconductor substrate in a metal-containing precursor dose chamber, exposing the substrate surface to a dose of a metal-containing precursor gas to form a saturated layer of metal-containing precursor on the substrate surface, providing the substrate in a silicon-containing precursor dose chamber, exposing the substrate surface to a silicon-containing precursor gas, evacuating the silicon-containing precursor dose chamber and prior to exposing the substrate surface to any subsequent doses of the metal-containing precursor gas, repeating the steps of exposing the substrate to a silicon-containing precursor gas and evacuating the silicon-containing precursor dose chamber.

According to various embodiments, the steps of exposing the substrate to a silicon-containing precursor gas and evacuating the silicon-containing dose chamber may be repeated multiple times prior to exposing the substrate to any subsequent doses of the metal-containing precursor. In preferred embodiments, the steps are repeated from 2 to 10 times.

In some embodiments, the substrate may then be exposed again to the metal-containing precursor, and the process repeated until the gap is substantially filled. In some embodiments, the gap may be substantially filled after exposure to no more than a certain number of metal-containing precursor doses. For example, in some embodiments, filling the gap may require no more than four doses of the metal-containing precursor.

In some embodiments, the silicon-containing precursor is at high partial pressure at the beginning of the deposition reaction. In a preferred embodiment, the partial pressure of the silicon-containing precursor gas is at least 10 Torr. In some embodiments, the substrate is exposed the silicon-containing precursor gas for a time ranging from about 5 to 30 seconds.

The metal-containing precursor dose chamber and the silicon-containing precursor dose chamber may be the same chamber or different chambers. In a preferred embodiment, they are different chambers.

Another aspect of the invention relates to methods of filling a gap on a semiconductor substrate involving re-pressurizing the reactor chamber during deposition. The methods involve providing a semiconductor substrate in a metal-containing precursor dose chamber, exposing the substrate surface to a dose of a metal-containing precursor gas to form a saturated layer of metal-containing precursor on the substrate surface, providing the semiconductor substrate to a silicon-containing precursor dose chamber, exposing the substrate to a silicon-containing precursor gas, re-pressurizing the silicon-containing precursor dose chamber; and after re-pressurizing, again exposing the substrate to the silicon-containing precursor gas.

According to various embodiments, re-pressurizing the silicon-containing precursor dose chamber may increase the chamber pressure by at least 10 Torr and/or by a factor of 1.5–5. In some embodiments, re-pressurizing the chamber involves introducing a gas selected from an inert gas, oxygen and silane into the chamber. Inert gases are preferred, with nitrogen is particularly preferred.

According to various embodiments, the substrate may be exposed to the silicon-containing precursor gas prior to re-pressurization from a time ranging from 5–30 seconds, and preferably 5–15 seconds. The substrate may be exposed to the silicon-containing precursor gas after re-pressurization from a time ranging from 5–30 seconds, and preferably 5–15 seconds.

In some embodiments, the method may include, prior to exposing the substrate to any subsequent doses of the metal-containing precursor, repeating the steps of exposing the substrate to the silicon-containing precursor gas, re-pressurizing the chamber, and exposing the substrate to the silicon-containing precursor gas after re-pressurization.

DETAILED DESCRIPTION OF THE INVENTION

Figure 1:
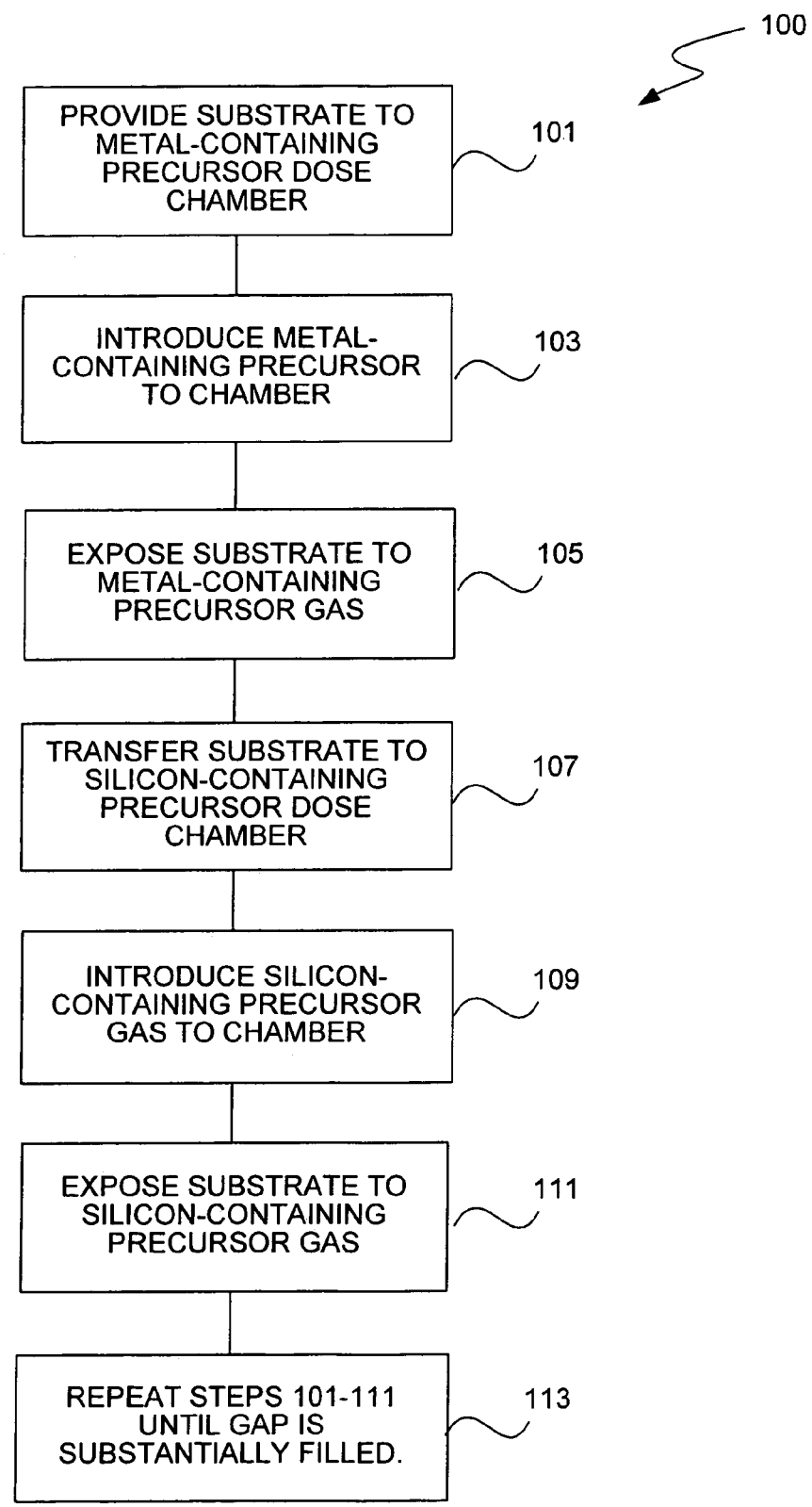
FIG. 1 a flowchart depicting the process flow of a method of filling gaps on a semiconductor substrate in accordance with a conventional RVD process.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, the present invention provides methods of forming conformal films with increased efficiency. The methods may be used with conformal film deposition techniques such as RVD and ALD. The methods are particularly suited for used with RVD.

Generally, conventional RVD methods involve sequentially depositing a plurality of atomic-scale films on a substrate surface by sequentially exposing and removing reactants to and from the substrate surface. First, a metal-containing precursor gas is injected into a chamber and the molecules of the gas are chemically or physically adsorbed to the surface of a substrate, thereby forming a "saturated layer" of the metal-containing precursor. Typically, the remaining gas in the chamber is then purged using an inert gas. Thereafter, a silicon-containing precursor gas is injected so that it comes in contact with the adsorbed layer of the metal-containing precursor and reacts to form a reaction product. Because the saturated layer of the metal-containing precursor is nominally thin and evenly distributed over the substrate surface, excellent film step coverage can be obtained. The substrate is exposed to a silicon-containing precursor for a period of time sufficient for silica film to grow to thickness in excess of one monolayer. Further cycles of substrate exposure to the metal-containing precursor, followed by exposure to the silicon-containing precursor, can be implemented and repeated as needed for multiple layers of material to be deposited.

Another deposition technique related to RVD is ALD. RVD and ALD are both surface-controlled reactions involving alternately directing the reactants over a substrate surface. Conventional ALD, however, depends on self-limiting typically monolayer producing reactions for both reactant gases. As an example, after the metal-containing precursor is adsorbed onto the substrate surface to form a saturated layer, the silicon-containing precursor is introduced and reacts only with the adsorbed metal-containing precursor. In this manner, a very thin and conformal film can be deposited. In RVD, as previously described, after the metal-containing precursor is adsorbed onto the substrate surface, the silicon-containing precursor reacts with the adsorbed metal-containing precursor and is further able to react to accumulate a self-limiting, but much thicker than one monolayer film. Thus, as stated previously, the RVD process allows for rapid film growth similar to using CVD methods but with the conformality of ALD type methods.

The differences between conventional ALD and RVD film formation are principally due to the difference between the thicknesses of the films formed after the completion of each type of process and arise from the nature of the metal-containing species used in the initial layer. In ALD, a single exposure to the metal-containing precursor leads to the formation of a monolayer of the product film (generally less than 5 Å thick), while in RVD, the metal-containing precursor catalyzes formation of more than a monolayer of silica film. The typical growth is greater than 150 Å/cycle. Typically, a silica RVD process utilizes trimethylaluminum (TMA) as the process aluminum precursor.

The present invention will now be described in detail, primarily with reference to RVD processes for the deposition component of the gap fill process. It should be understood that ALD processes may also be used for gap fill in accordance with the invention. Relevant details of ALD processes in general are described in M. Ritala and M. Leskela, "Atomic layer deposition", Chapter 2, Handbook of thin film materials, vol. 1, "Deposition and processing of thin films", Hari Singh Nalwa, Ed. (Academic Press, 2002). Given these details and the description provided herein, one of skill in the art would be able to implement the ALD aspect of the invention.

FIG. 1 is a flow chart depicting a conventional RVD process. The process 100 starts with a substrate being provided to a metal-containing precursor dose chamber (101). A metal-containing precursor is then introduced to the chamber (103). The substrate is exposed to the metal-containing precursor so that the metal-containing precursor is adsorbed onto the substrate surface (105).

Generally, separate chambers are used for the exposure to the metal-containing precursor in operations 103 and 105 and exposure to the silicon-containing precursor in the following operations. Thus, the substrate is then transferred to a silicon-containing precursor dose chamber (107). The silicon-containing precursor is then introduced to the silicon-containing precursor dose chamber (109) and the substrate is exposed to the silicon-containing precursor in order for a silicon oxide film to be deposited on the substrate (111). Generally the substrate is exposed to the silicon-containing precursor until the reaction stops and film is no longer deposited. Exposure to the metal-containing precursor and the silicon-containing precursor described in operations 101–111 constitute one cycle of the RVD process. Multiple cycles are then performed until the desired amount of film is deposited (for example, to fill a gap on the substrate) (113). Each cycle begins by transferring the substrate to the metal-containing precursor dose chamber.

Figure 2:
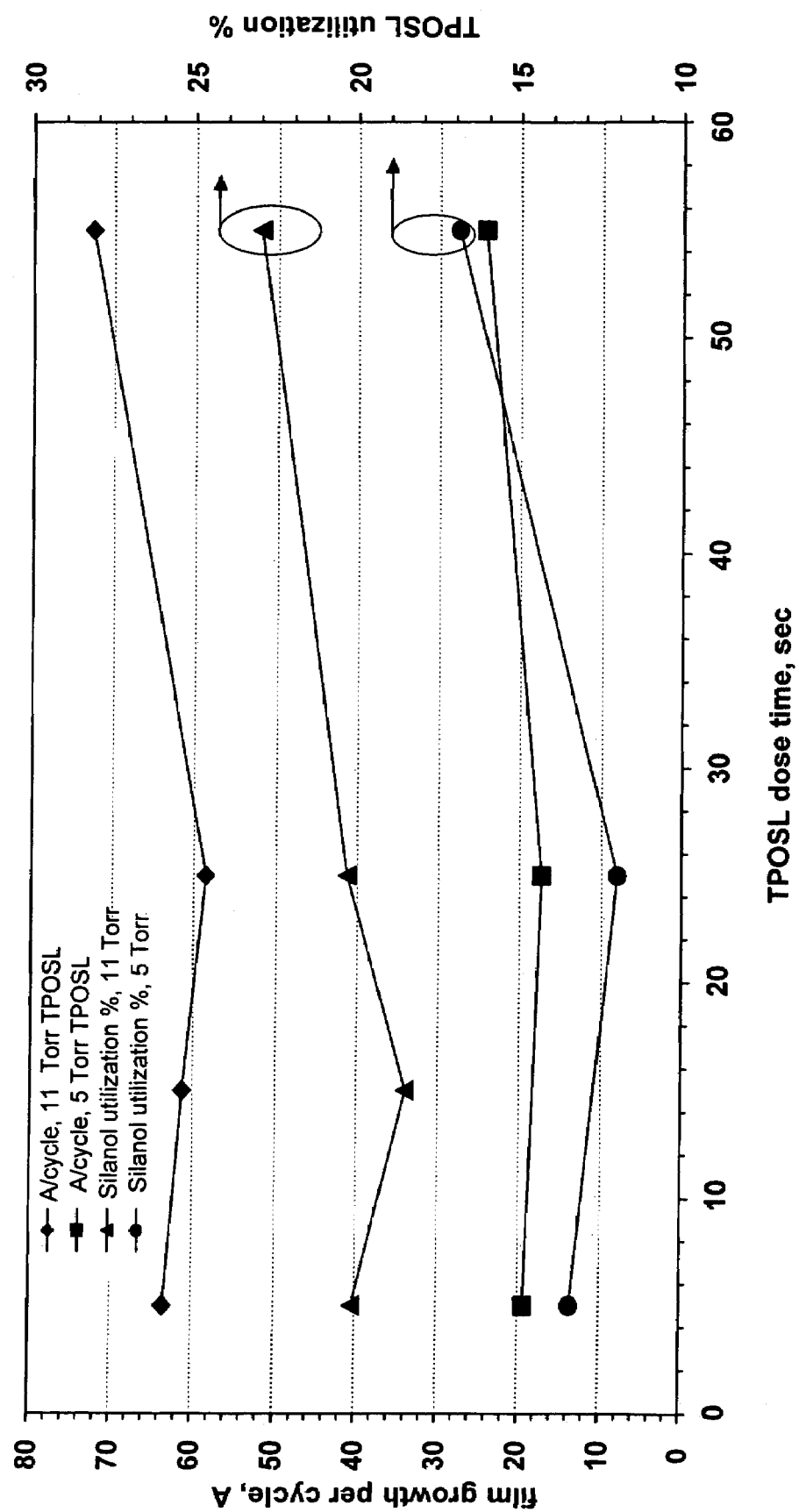
FIG. 2 is a graph depicting silica growth and TPOSL conversion as functions of TPOSL partial pressure and dose time for a conventional RVD process.

As discussed above, the RVD reaction is self-limiting. This can be seen in FIG. 2, which shows film growth and silicon-containing precursor (tris(tert-pentoxy)silanol (TPOSL)) conversion as functions of TPOSL dose time in a conventional RVD process for TPOSL partial pressures of 5 Torr and 11 Torr. For a particular partial pressure, the film growth and reactant conversion are constant with respect to dose time. (Although experimental error is not shown on the graph, variations in the film growth and reactant conversion for different dose times are within the experimental error). For the conventional RVD operation used to generate data in FIG. 2, a TPOSL dose time of 54 seconds per cycle results in the same film growth and reactant conversion as a dose time of 4 seconds per cycle.

As discussed above, the silicon-containing precursor reacts with the adsorbed metal-containing precursor and reacts further to accumulate a film. The reaction of the silicon-containing precursor produces the film as well as byproducts. One commonly used silicon-containing precursor is tris(tert-pentoxy)silanol or TPOSL, the molecular formula of which is $(C_5H_{11}O)_3SiOH$. The reaction of TPOSL to form silicon oxide film is shown below:

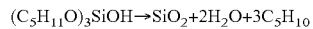

$(C_5H_{11}O)_3SiOH \rightarrow SiO_2 + 2H_2O + 3C_5H_{10}$

Thus, water and cyclopentene ($C_5H_{10}$) gas are byproducts of the deposition reaction. Other byproducts are produced including alcohols and other hydrocarbons. The metal-containing precursor may be incorporated into the film; for example, aluminum oxide may be incorporated into the film when an aluminum-containing precursor is used.

A recognized reaction limiting mechanism is the inhibition of diffusion of the precursor to the catalytic sites on the adsorbed layer of metal-containing precursor. Diffusion of the silicon-containing precursor is inhibited by cross-linking between molecules of the deposited film. If diffusion inhibition were the sole rate-controlling mechanism, as previously believed, adsorption of another layer of metal-containing precursor would be required to grow more film.

While the diffusion inhibition described above is believed to be one mechanism of limiting the deposition reaction, it is believed that another important reaction-limiting mechanism that has not been previously recognized is the inhibition of growth by the reaction byproducts. Without being bound by a particular theory, it is believed that byproducts of the silicon oxide producing reaction (e.g., of TPOSL to $SiO_2$ shown above) are adsorbed onto the catalytic precursor sites, thereby inhibiting the deposition of silicon oxide.

Evidence of this is found by examining enthalpies of adsorption of precursor and byproducts on the catalytic sites. For example, isopropanol and water are byproducts in a deposition reaction with a tris(isopropoxy)silanol precursor. In a simulation of a deposition reaction, the enthalpies of adsorption on aluminum sites of an adsorbed aluminum-containing precursor were determined to be:

water=35.6 kcal/mol isopropanol=37.5 kcal/mol tris(isopropoxy)silanol=37.8 kcal/mol The difference in enthalpies of adsorption of the silicon-containing precursor and the reaction byproducts on aluminum sites is less than 2.5 kcal/mol. This indicates that deposition of silicon oxide on the metal-containing precursor layer competes with adsorption of the byproducts on metal-containing precursor sites. The byproducts inhibit reactant conversion.

Figure 3:
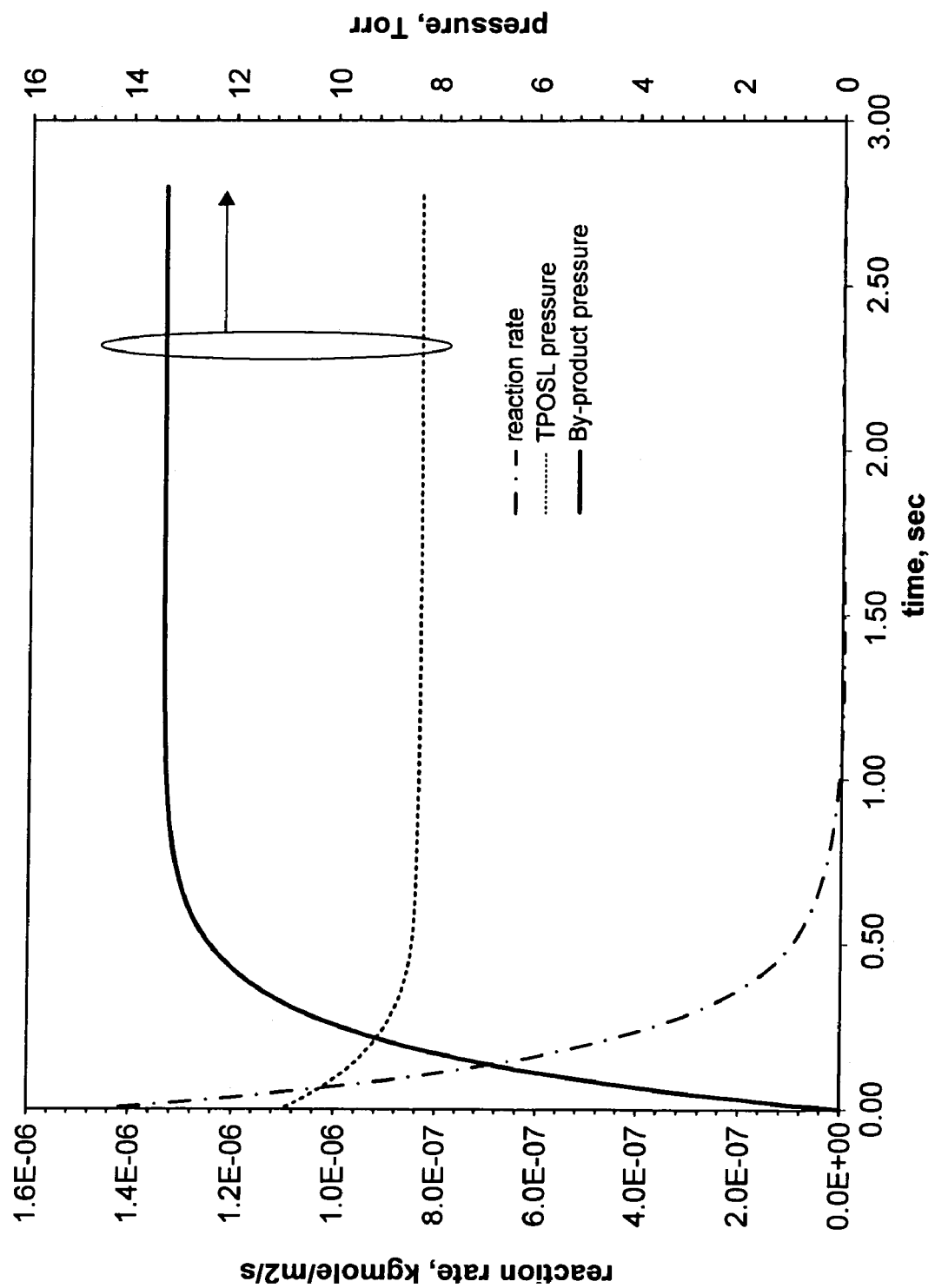
FIG. 3 is a graph depicting reaction rate and gas phase composition changes as functions of TPOSL exposure time in a conventional RVD process.

FIG. 3 shows results of modeling reaction rate and gas phase composition changes as functions of TPOSL dose in a conventional RVD process. Reaction rate, TPOSL partial pressure and byproduct partial pressure are shown. Conditions in the reactor reach steady state in less than a second of dose time, with the reaction rate falling to zero, and TPOSL partial pressure leveling off at a partial pressure of about 8.2 Torr from an initial pressure of about 11 Torr. Byproduct pressure levels off at about 13 Torr. Although not shown in FIG. 3, the model predicted a TPOSL conversion of 24% and 80 Å film growth per cycle, in agreement with the experimental results obtained for an initial TPOSL partial pressure of 11 Torr shown in FIG. 2. Exact values of reactant conversion, film growth and time for the reaction rate to reach zero are dependent on the particular process conditions. However, FIG. 3 demonstrates that for any conventional RVD process, the reaction rate falls to zero once byproduct partial pressure has reached a certain level.

PROCESSES

The methods of the present invention reduce the amount of metal-containing precursor and/or silicon containing precursor materials required to grow a given amount of oxide on a substrate.

Figure 4:
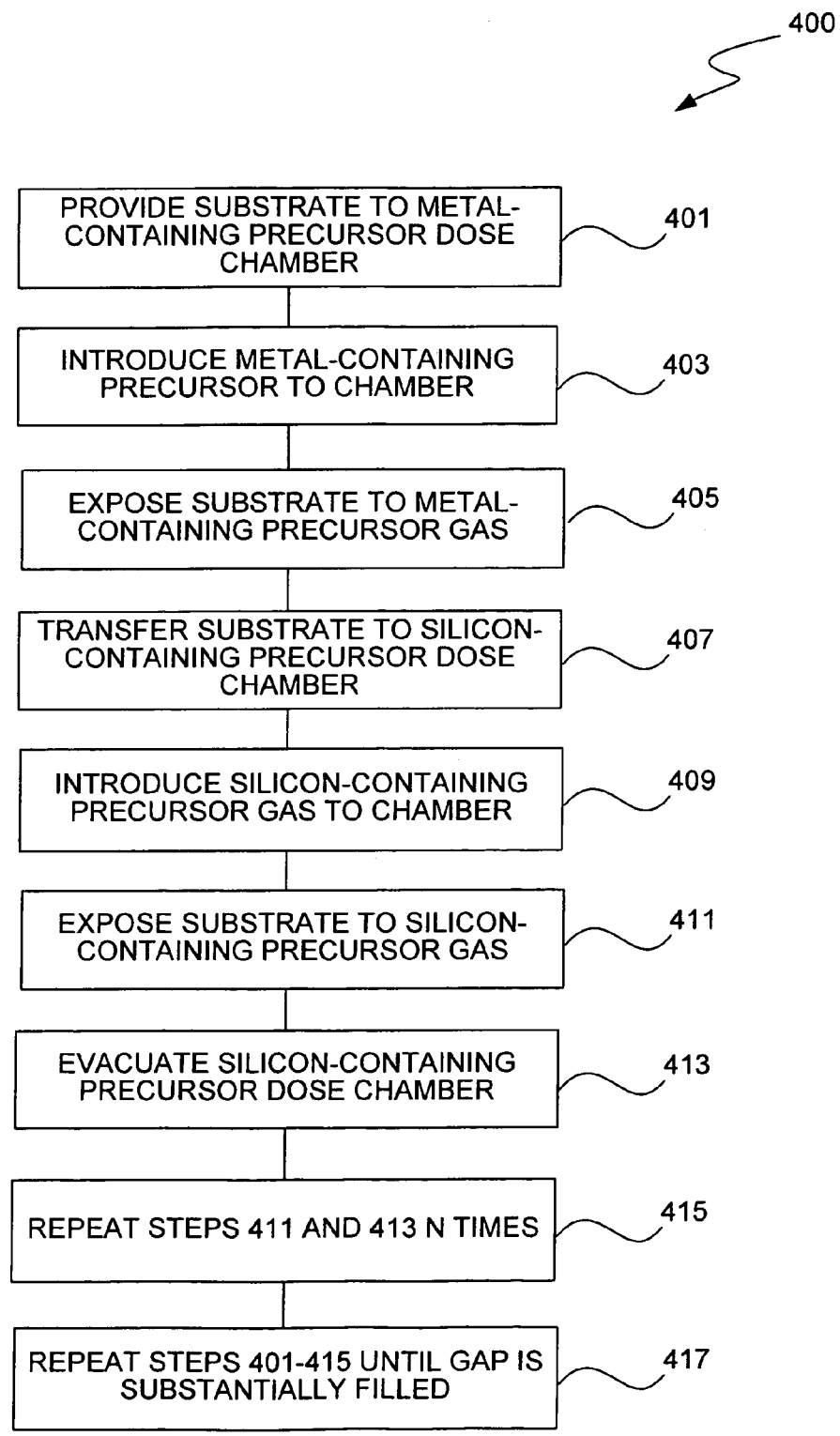
FIG. 4 is a flowchart depicting the process flow of a method of filling gaps on a semiconductor substrate in accordance with one embodiment of the present invention.

In some embodiments, the methods of the invention include introducing multiple doses of the silicon-containing precursor for each cycle. A process flow for illustrating the steps of a method according to one such embodiment is depicted in FIG. 4. The process 400 starts with a substrate being provided to a catalyst dose chamber (401). The metal-containing precursor is then introduced to the chamber (403). The substrate is exposed to the metal-containing precursor so that the metal-containing precursor is adsorbed onto the substrate surface (405). In the embodiment shown in FIG. 4, separate chambers are used for the exposure to the metal-containing precursor and exposure to the silicon-containing precursor. Thus, the substrate is then transferred to a silicon-containing precursor dose chamber (407). The silicon-containing precursor is then introduced to the dose chamber (409) and the substrate is exposed to the silicon-containing precursor in order for a silicon oxide film to be deposited on the substrate (411). Up until this point, the process 400 is the same as a conventional RVD process as described in FIG. 1. According this embodiment, the silicon-containing precursor dose chamber is evacuated (413). An evacuation with a pump purge as is well known in the art may be used. After the reactor is evacuated, the operations 411 and 413 are repeated N times (415). N is the number of doses of silicon-containing precursor material per cycle. N may be a predetermined number, for example, 2, 3, 4, 5, 6, etc. For example, if N is 3, the substrate is exposed to three doses of the silicon-containing precursor per cycle. In other embodiments, the silicon-containing precursor dosing and chamber evacuation steps may be repeated until the film reaches a certain thickness, rather than a predetermined number. Steps 401–415 constitute one cycle of the RVD process according to this embodiment. Multiple cycles are then performed until the desired amount of film is deposited (for example, to fill a gap on the substrate) by repeating steps 401–415 (417).

The process described in FIG. 4 reduces the number of metal-containing precursor doses required to deposit a given amount of film. There are several benefits resulting from this. First, the amount of metal-containing precursor required to deposit the required amount of file (e.g. to fill a gap) is reduced. As the metal-containing precursor may contribute significantly to the cost of operation of the process, it is desirable to limit the amount of precursor used. Second, as discussed above, exposure to the metal-containing precursor and the silicon-containing precursor typically occur in different chambers, requiring wafer transfer for each metal-containing precursor dose. Reducing the number of metal-containing precursor doses reduces the number of transfer operations. Third, the amount of aluminum incorporated into the dielectric film is lowered.

Figure 5:
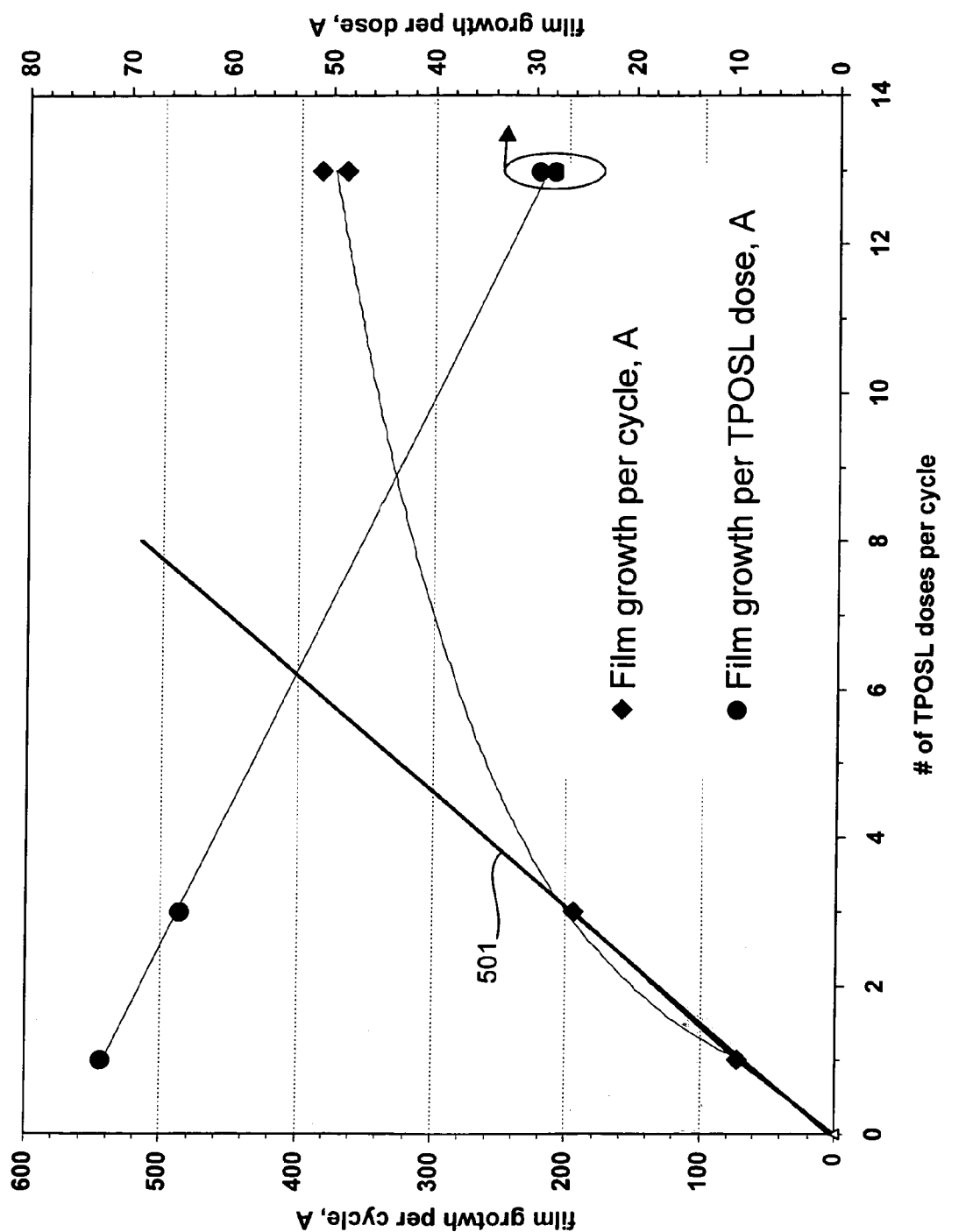
FIG. 5 is a graph depicting film growth per cycle and film growth per TPOSL dose as functions of the number of TPOSL doses per cycle for an RVD process in accordance with one embodiment of the invention.

The optimal number doses per cycle may be found by determining the film growth per cycle and per dose of silicon-containing precursor. FIG. 5 is a graph depicting film growth per cycle and film growth per TPOSL dose as a function of the number of TPOSL doses per cycle for an RVD process. Although the results depicted in FIG. 5 are for a particular set of process conditions, the general trends apply to other process conditions. Film growth per dose of TPOSL decreases with successive doses of TPOSL. For example, for the process shown in FIG. 5, the third dose of TPOSL results in about 65 Å of film growth, while the thirteenth dose results in less than 30 Å. Thus, the film growth per cycle levels off as the number of doses increases, as can be seen in FIG. 5. For a particular process, an optimal number of doses may be determined. In FIG. 5, for example, a trendline was plotted to determine the optimal number of doses for the particular process used to generate the film growth data. Line 501 indicates that for this process the optimal number of TPOSL doses per cycle is three. The slope of the film thickness curve is constant until about three cycles, after which point it decreases. As the number of doses per cycle increases, the amount of silicon-containing precursor relative to the amount to metal-containing precursor increases. The optimal number may depend on other factors such as the relative cost of the silicon-containing precursor to the metal-containing precursor, as well as on the conditions of the particular process.

Figure 6:
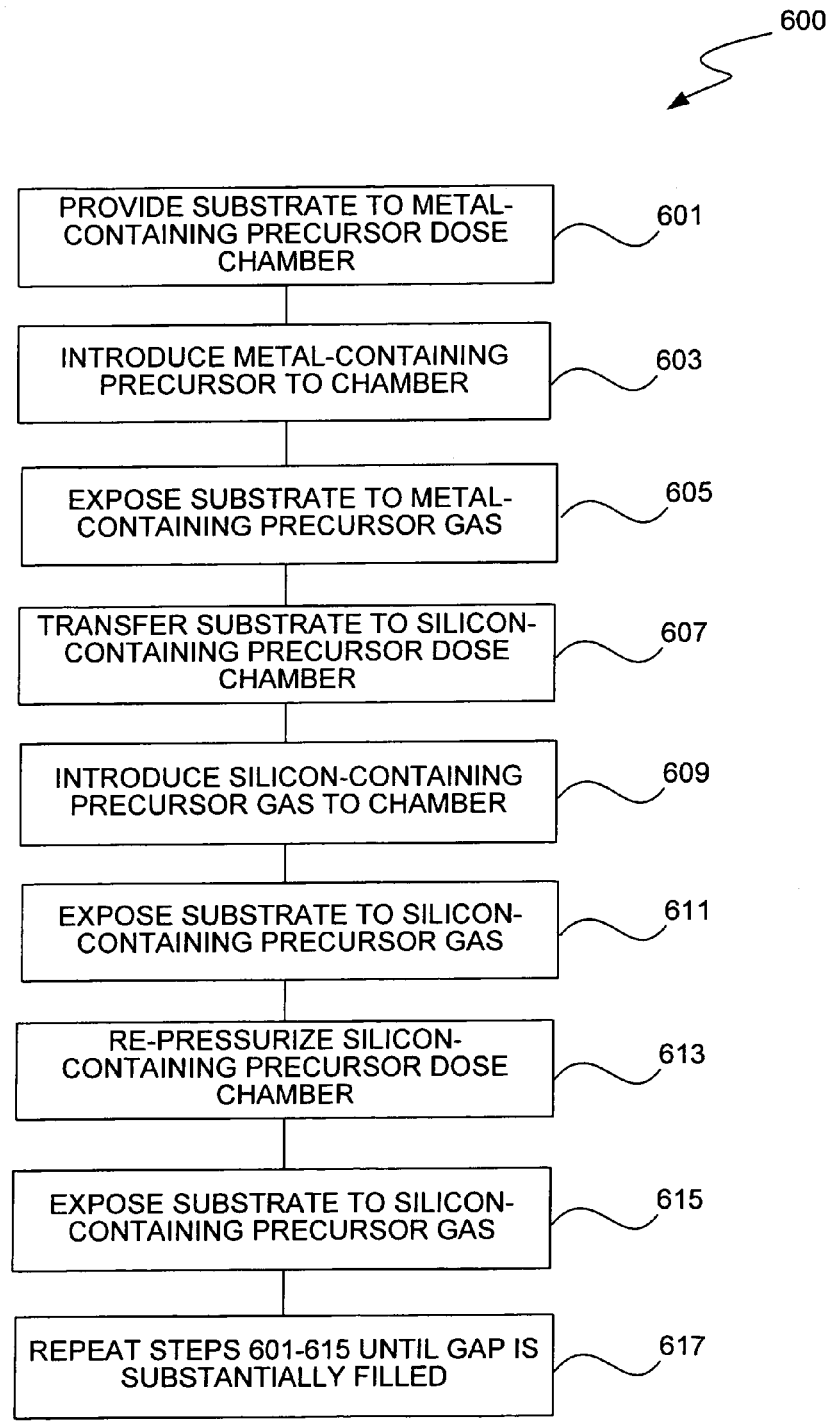
FIG. 6 is a flowchart depicting the process flow of a method of filling gaps on a semiconductor substrate in accordance with one embodiment of the present invention.

Another aspect of the invention involves increasing the utilization of the silicon-containing precursor. In some embodiments, this is accomplished by re-pressurizing the RVD reaction chamber during exposure to the silicon-containing precursor. FIG. 6 is a flowchart depicting the process flow of one embodiment of a method of filling gaps on a semiconductor substrate where the RVD chamber is re-pressurized during wafer exposure to the silicon-containing precursor. The first steps of the process 600 are identical to those described in FIG. 1, with a substrate being provided to a catalyst dose chamber (601). The metal-containing precursor is then introduced to the chamber (603). The substrate is exposed to the metal-containing precursor so that the metal-containing precursor is adsorbed onto the substrate surface (605). The substrate is then transferred to a silicon-containing precursor dose chamber (607). The silicon-containing precursor is then introduced to the dose chamber (609) and the substrate is exposed to the silicon-containing precursor in order for a silicon oxide film to be deposited on the substrate (611). Up until this point, the process 600 is the same as the RVD process as described in FIG. 1. According this embodiment, the silicon-containing precursor dose chamber is re-pressurized (613). The chamber may be re-pressurized by introducing a gas such as an inert gas. After re-pressurization, the substrate is again exposed to the silicon-containing precursor (615). Multiple cycles are then performed until the gap is filled or the desired amount of film is deposited by repeating steps 601–615 (617).

Figure 7:
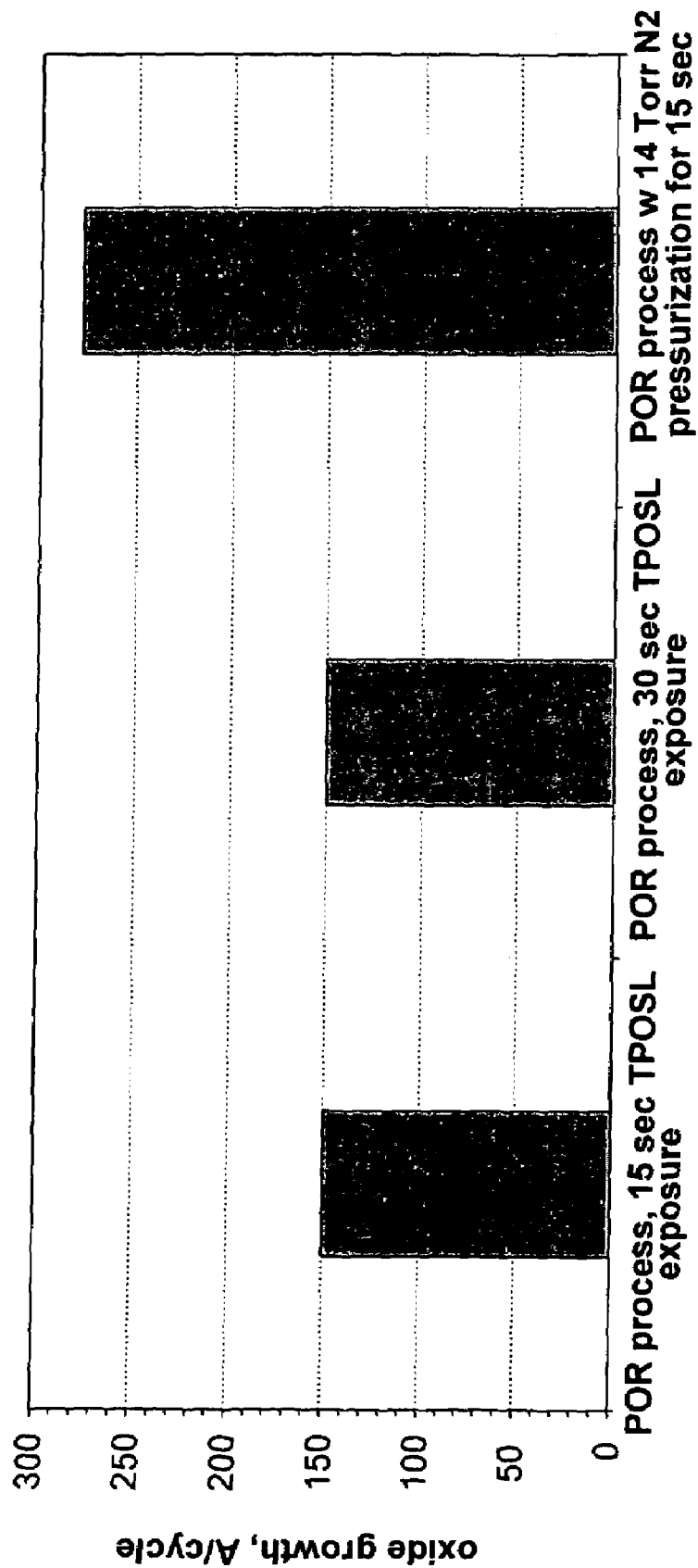
FIG. 7 is a graph comparing oxide growth per TPOSL dose for a process without re-pressurization and for a process according to one embodiment of the present invention.

FIG. 7 is a graph comparing oxide growth per TPOSL dose for a conventional RVD process and for a process with re-pressurization. The first two bars on the graph show oxide growth for 15 seconds and 30 seconds of TPOSL exposure. 15 seconds of exposure resulted in 150 Å/cycle of oxide deposited. Increasing the exposure time to 30 seconds did not result in any additional oxide film deposited. This indicates that for the particular process conditions used, the deposition reaction rate reached zero by an exposure time of 15 seconds. The third or rightmost bar on graph shows the same process conditions, but with 15 seconds of exposure followed by re-pressurization the chamber with 14 Torr $N_2$, followed by another 15 seconds of exposure. Re-pressurization almost doubled the film growth per cycle, from 150 Å/cycle to 280 Å/cycle. Thus, re-pressurization increases conversion of the silicon-containing precursor.

Without being bound by a particular theory, it is believed that re-pressurization displaces the silicon-containing precursor from the volume behind the showerhead, thereby increasing the concentration of silicon-containing precursor above the substrate. Over 80% of the volume in a RVD reaction chamber may sit behind a showerhead. Introducing the $N_2$ pulse displaces precursor molecules that otherwise would have to rely on diffusion from this volume to reach the substrate surface.

Figure 8:
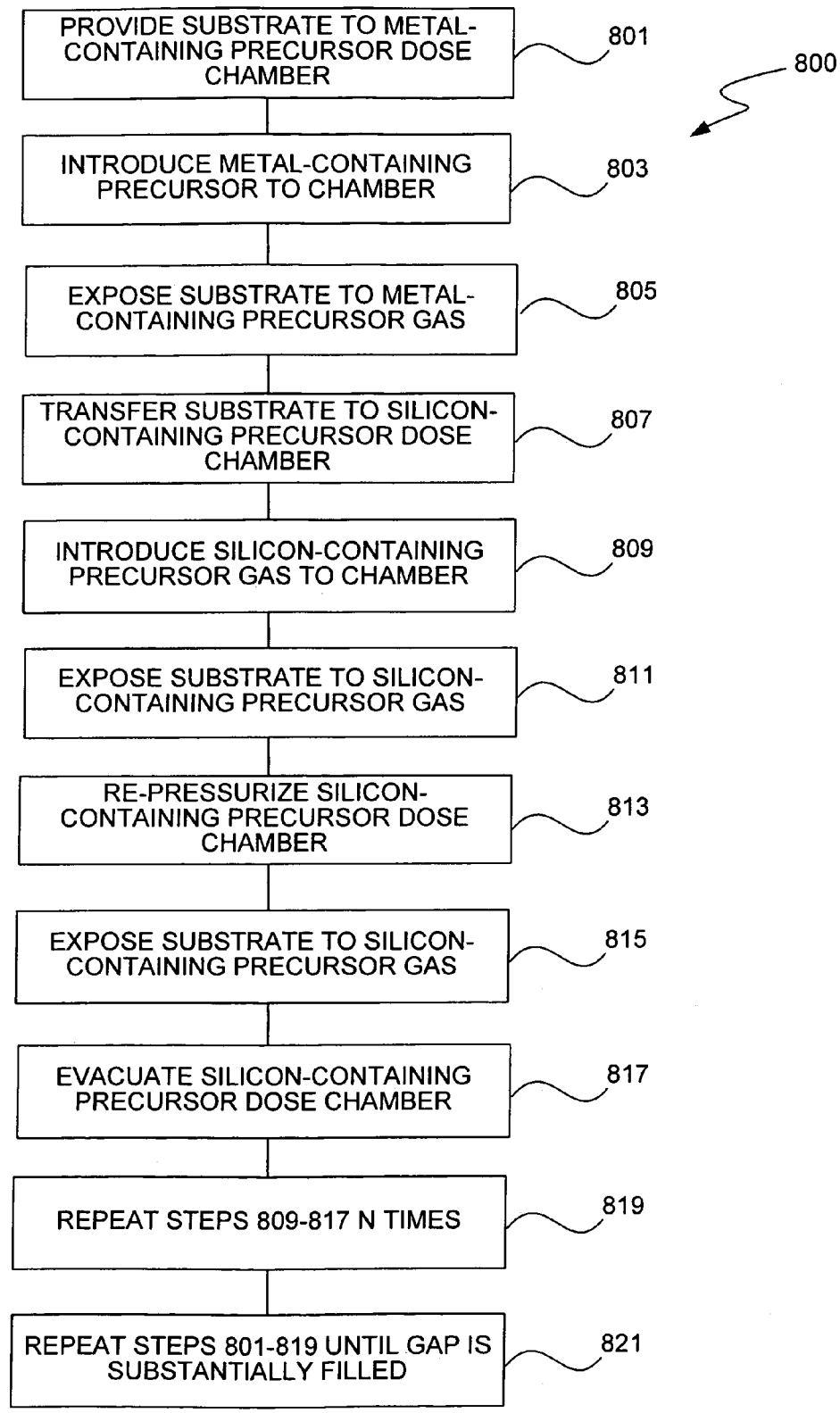
FIG. 8 is a flowchart depicting the process flow of a method of filling gaps on a semiconductor substrate in accordance with one embodiment of the present invention.

According to various embodiments, the methods of the invention may include introducing multiple doses of the silicon-containing precursor per cycle (as shown in FIG. 4) and re-pressurizing the chamber during exposure to each dose of the silicon-containing precursor (as shown in FIG. 6). One such embodiment is depicted in the process flow chart in FIG. 8. The process 800 starts with a substrate being provided to a metal-containing precursor dose chamber (801). The metal-containing precursor is then introduced to the chamber (803). The substrate is exposed to the metal-containing precursor so that the metal-containing precursor is adsorbed onto the substrate surface (805). The substrate is then transferred to a silicon-containing precursor dose chamber (807). The silicon-containing precursor is introduced to the chamber (809) and the substrate is exposed to the silicon-containing precursor in order for a silicon oxide film to be deposited on the substrate (811). The reactor chamber is re-pressurized (813). After re-pressurization, the substrate is again exposed to the silicon-containing precursor (815). The silicon-containing precursor dose chamber is then evacuated (817). Operations 809–817 are repeated N times (819), with N being the number of doses of silicon-containing precursor material per cycle. Multiple cycles are then performed until the desired amount of film is deposited (for example, to fill a gap on the substrate) by repeating steps 801–819 (821).

APPARATUS

Figure 9:
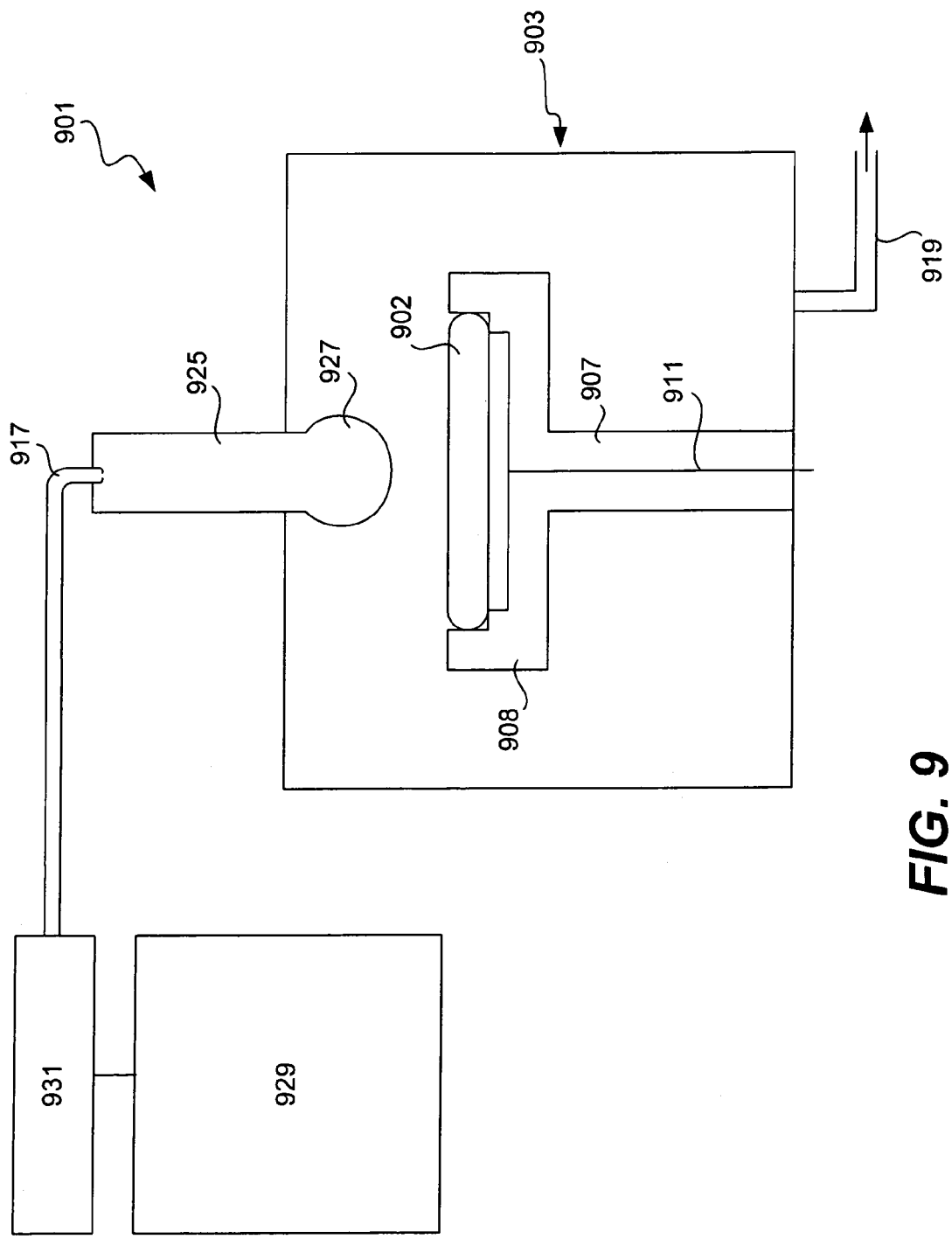
FIG. 9 is a block diagram depicting various reactor components arranged for implementing the deposition of dielectric films in the present invention.

FIG. 9 is a block diagram depicting some components of a suitable reactor for performing a deposition process in accordance with this invention. Note that this apparatus may be used for ALD or RVD processes and is only an example of suitable apparatus in accordance with the present invention. Many other apparatuses and systems, including a multi-chambered apparatus as discussed above, may be used.

As shown, a reactor 901 includes a process chamber 903, which encloses components of the reactor and serves to contain the reactant gases and provide and area to introduce the reactant gases to substrate 909. The chamber walls may be made of or plated with any suitable material, generally a metal that is compatible with the deposition and associated processes conducted therein. In one example, the process chamber walls are made from aluminum. Within the process chamber, a wafer pedestal 907 supports the substrate 909. The pedestal 907 typically includes a chuck 908 to hold the substrate in place during the deposition reaction. The chuck 908 may be an electrostatic chuck, a mechanical chuck or various other types of chuck as are available for use in the industry and/or research. The pedestal comprises resistive heating elements. The reactant gases, as well as inert gases during purge, are introduced individually into the reactor at tube 925 via inlet 917. A showerhead 927 may be used to distribute the gas flow uniformly in the process reactor. Reactant gases are introduced through a gas supply inlet mechanism including orifices. There may be multiple reactant gas tubes and inlets. A vacuum pump connected to outlet 919 can draw out gases between RVD cycles. Precursor gas may be supplied from a reservoir 929 that may hold the gas at the desired pressure until it is supplied to the chamber. Vaporizer 931 may vaporize the precursor before it is supplied to the chamber.

PROCESS PARAMETERS

Metal-containing Precursors

Examples of metal-containing precursors include aluminum, zirconium, hafnium, gallium, titanium, niobium, or tantalum compounds. In embodiments wherein RVD is employed, the metal-containing precursor is a transition metal precursor, preferably an aluminum-containing precursor, capable of aiding the catalytic polymerization of the subsequently added silicon-containing precursor to produce a film thicker than a monolayer. In some preferred embodiments, for example, hexakis(dimethylamino)aluminum ($Al_2(N(CH_3)_2)_6$) or trimethylaluminum ($Al(CH_3)_3$) are used. Other suitable aluminum-containing precursors include, for example, triethylaluminum ($Al(CH_2CH_3)_3$) or aluminum trichloride ($AlCl_3$). Exposure times suitable for forming a saturated layer are typically only seconds.

Silicon-containing Precursors

In embodiments wherein RVD is employed, the silicon-containing precursor should be capable of polymerization when exposed to the adsorbed aluminum-containing precursor to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol (($C_4H_9O)_3SiOH$), tris(tert-pentoxy)silanol(($C_5H_{11}O)_3SiOH$), di(tert-butoxy)silanediol (($C_4H_9O)_2Si(OH)_2$), tris(isopropoxy)silanol and methyl di(tert-pentoxy)silanol.

Other gases may be introduced to the chamber with the silicon-containing precursor gas. Such gases include an oxygen source and/or a hydrolyzing agent. Examples of oxygen sources include $O_2$, $O_3$, $H_2O_2$, $NO_2$, $N_2O_3$, $N_2O_5$ or $HNO_3$. Examples of hydrolyzing agents are compounds containing hydrogen with some protoic character such as $H_2O$ or $H_2O_2$, $H_3PO_4$, HF or HCl. Additionally, any dopant gas may be introduced, including phosphorous-, fluorine- and carbon-containing dopant gases. A carrier gas may also be used. Typically the carrier gas is an inert gas.

Temperature and Pressure

Chamber pressure in conventional RVD processes is typically between 500 mTorr and 2 Torr. However, in a preferred embodiment, the silicon-containing precursor gas is at a high partial pressure. FIG. 1 shows that higher silanol conversion and film growth is obtained for a partial pressure of 11 Torr than for a partial pressure of 5 Torr. The partial pressure of the silicon-containing precursor gas may be as high as 200 Torr. In preferred embodiments, the partial pressure is between about 10 Torr and 40 Torr. In a particularly preferred embodiment of the present invention, the partial pressure of the silicon-containing-precursor gas is about 10 Torr. Deposition of the silicon-containing precursor at high partial pressure is described in U.S. patent application Ser. No. 11/026,284, filed Dec. 30, 2004, which is hereby incorporated by reference in its entirety. Partial pressure as used above refers to the partial pressure of the silicon-containing precursor at the onset of the deposition reaction.

In some embodiments wherein multiple doses of the silicon-containing precursor per cycle are introduced, the partial pressure of the silicon-containing precursor may be increased from dose to dose.

Wafer temperatures as used for standard conformal film deposition processes may be used in the methods of the present invention. In preferred embodiments wherein the metal-containing precursor is an aluminum-containing precursor, the temperature of the substrate is between about 150° C. and 250° C. during exposure to the metal-containing precursor. In particularly preferred embodiments, the temperature of the substrate is between about 150° C. and 200° C.

In preferred embodiments wherein the silicon-containing precursor is a silanol, the temperature of the substrate is between about 200° C. and 300° C. during exposure to the silanol. In a particularly preferred embodiment, the temperature is between about 225° C. and 300° C. In an even more particularly preferred embodiment, the temperature is between about 250° C. and 300° C.

Exposure Time

The substrate should not be exposed to the silicon-containing precursor after the deposition reaction has stopped. The optimal exposure time is a function of particular process conditions including temperature and pressure. In some embodiments exposure times may range from 5–30 seconds.

Re-pressurization

The reactor chamber may be re-pressurized during exposure to the silicon-containing precursor by introducing a gas to the chamber. Suitable gases include $N_2$, Ar, He, other inert gases, $O_2$, a dopant gas or silane. In a preferred embodiment, the chamber is re-pressurized with an inert gas.

In some embodiments, the re-pressurization increases the chamber pressure by 1.5–5 times. In some embodiments, the re-pressurization may increase the pressure by at least 10 Torr.

OTHER EMBODIMENTS

This method applies to the deposition of silica (USG). However, this method may also be used for depositing doped silica films, such as fluorine-doped silicate glass (FSG), phosphosilicate glass (PSG), boro-phospho-silicate glass (BPSG), or carbon doped low-k materials.

Other deposition co-reactants, such as silanols with varying substituents (e.g., more than one kind of alkoxy substituent) may be used to improve the film characteristics. For an example, see U.S. patent application Ser. No. 10/874,814, filed Jun. 22, 2004, titled "Mixed Alkoxy Precursors and Methods of Their Use for Rapid Vapor Deposition of $SiO_2$ Films." Furthermore, the properties of the dielectric film may be improved by other means as well, including by using an aluminum oxide nucleation layer formed by ALD prior to the application of the silica layer. See, for example, U.S. patent application Ser. No. 10/875,158, filed Jun. 22, 2004, titled "Silica Thin Films Produced By Rapid Surface Catalyzed Vapor Deposition (RVD) Using a Nucleation Layer." Note also that this technique may be used in combination with a phosphorous-containing film as described in U.S. patent application Ser. No. 10/874,808, filed Jun. 22, 2004, titled "Aluminum Phosphate Incorporation In Silica Thin Films Produced By Rapid Surface Catalyzed Vapor Deposition (RVD)." The above-referenced applications are incorporated by reference in their entirety for all purposes.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of filling a gap on a semiconductor substrate, the method comprising:
    a) providing a semiconductor substrate in a metal-containing precursor dose chamber;
    b) exposing the substrate surface to a dose of a metal-containing precursor gas to form a saturated layer of metal-containing precursor on the substrate surface;
    c) providing the semiconductor substrate in a silicon-containing precursor dose chamber; and
    d) introducing a dose of silicon-containing precursor gas to the chamber; and
    e) after the dose is introduced to the chamber, exposing the substrate to the dose of the silicon-containing precursor gas such that the gas reacts with the saturated layer of metal-containing precursor to deposit silicon oxide;
    wherein (e) is completed prior to introducing a subsequent dose of silicon-containing precursor gas and (e) comprises: (i) exposing the substrate to the dose of the silicon-containing precursor gas for a first period of time (ii) re-pressurizing the silicon-containing precursor dose chamber during exposure to the dose of the silicon-containing precursor gas, thereby increasing the pressure in the chamber; and (iii) after re-pressurizing, exposing the substrate to the dose of the silicon-containing precursor gas for a second period of time.

2. The method of claim 1, further comprising repeating steps (a)–(e) until the gap is substantially filled.

3. The method of claim 1, wherein step (ii) comprises increasing the chamber pressure by at least 10 Torr.

4. The method of claim 1, wherein step (ii) comprises increases the chamber pressure by a factor of 1.5–5.

5. The method of claim 1, wherein step (ii) comprises introducing a gas selected from nitrogen, argon, helium and oxygen into the chamber.

6. The method of claim 5, wherein step (ii) comprises introducing nitrogen into the chamber.

7. The method of claim 1, wherein the first period of time ranges from about 5 to 15 seconds.

8. The method of claim 1, wherein the second period of time ranges from about 5 to 15 seconds.

9. The method of claim 1, wherein the silicon-containing precursor is at least one of tris(tert-butoxy)silanol, tris(tert-pentoxy)silanol, di(tert-butoxy)sinlandiol and methyl di(tert-pentoxy)silanol.

10. The method of claim 1, wherein the temperature of the substrate is between about 200° C. and 300° C. during exposure to the silicon-containing precursor gas.

11. The method of claim 10, wherein the temperature of the substrate is between about 150° C. and 250° C. during exposure to the metal-containing precursor gas.

12. The method of claim 1, wherein the metal-containing precursor is an aluminum-containing precursor.

13. The method of claim 12, wherein the aluminum-containing precursor is at least one of hexakis(dimethylamino) aluminum, trimethylaluminum, triethylaluminum and aluminum trichloride.

14. The method of claim 13, wherein the aluminum-containing precursor is trimethyl aluminum.

15. The method of claim 1, wherein the partial pressure of the silicon-containing gas at the beginning of step (d) is equal to or greater than about 10 Torr.

16. The method of claim 1, further comprising:
    f) prior to exposing the substrate surface to any subsequent doses of the metal-containing precursor gas, repeating step (d) and (e).

* * * * *

UNITED STATES PATENT AND TRADEMARK OFFICE
CERTIFICATE OF CORRECTION

| | | |
|---|---|---|
| PATENT NO. | : 7,109,129 B1 | Page 1 of 1 |
| APPLICATION NO. | : 11/077108 | |
| DATED | : September 19, 2006 | |
| INVENTOR(S) | : George D. Papasoulitis | |

It is certified that error appears in the above-identified patent and that said Letters Patent is hereby corrected as shown below:

Column 5, line 58, change "cyclopentene" to --pentene--.

Signed and Sealed this

Thirty-first Day of July, 2007

JON W. DUDAS
*Director of the United States Patent and Trademark Office*